US006559008B2

(12) United States Patent  (10) Patent No.: US 6,559,008 B2
Rabkin et al.  (45) Date of Patent: May 6, 2003

(54) NON-VOLATILE MEMORY CELLS WITH SELECTIVELY FORMED FLOATING GATE

(75) Inventors: Peter Rabkin, Cupertino, CA (US); Hsingya Arthur Wang, San Jose, CA (US); Kai-Cheng Chou, San Jose, CA (US)

(73) Assignee: Hynix Semiconductor America, Inc., San Jose, CA (US)

( * ) Notice: Subject to any disclaimer, the term of this patent is extended or adjusted under 35 U.S.C. 154(b) by 0 days.

(21) Appl. No.: 09/971,434

(22) Filed: Oct. 4, 2001

(65) Prior Publication Data

US 2003/0068860 A1 Apr. 10, 2003

(51) Int. Cl.$^7$ .............................................. H01L 21/336
(52) U.S. Cl. ...................... 438/257; 438/255; 438/257; 438/258; 438/259; 438/266; 438/267
(58) Field of Search ............................. 438/255, 257, 438/258, 259, 266, 267

(56) References Cited

U.S. PATENT DOCUMENTS 6,130,129 A  * 10/2000 Chen .......................... 257/315
6,440,795 B1  *  8/2002 Harshfield ................... 438/255

OTHER PUBLICATIONS

U.S. patent application Ser. No. 09/948,612, Rabkin et al., filed Sep. 7, 2001.
H. Watanabe et al., "A New Stacked Capacitor Structure Using Hemispherical–Grain (HSG) Poly–Silicon Electrodes", Extended Abstracts of the 22nd Conference on Solid State Devices and Materials, Sendai, 1990, pp. 873–876.
M. Sakao, et al., "A Capacitor–Over–Bit–Line (COB) Cell with a Hemispherical–Grain Storage Node for 64Mb DRAMs", IEEE, 1990, pp 27.3.1–27.3.4.
H. Watanabe, et al., "A New Cylindrical Capacitor Using Hemispherical Grained Si (HSG–Si) for 256Mb DRAMs", IEEE, 1992, pp. 10.1.1–10.1.4.
H. Watanabe, et al., "Hemispherical Grained Silicon (HSG–Si) Formation on In–Situ Phosphorous Doped Amorphour–Si Using the Seeding Method", Extended Abstracts of the 1992 International Conference on Solid State Devices and Materials, Tsukuba, 1992, pp. 422–424.
M. Sakao, et al., H. Wakanabe, et al., "6. Capacitor Structures and Processes", VLSI Technology Short Course, 1998, pp. 3–51–3–52.
F. Arai, et al., "High–Density (4.4F$^2$) NAND Flash Technology Using Super–Shallow Channel Profile (SSCP) Engineering", IEEE, 2000, 33.4.1–33.4.4.
PTJ. Gennissen, et al., "Selective epitaxial growth of (poly) silicon", May 9, 2001.

* cited by examiner

Primary Examiner—David Nelms
Assistant Examiner—Mai-Huong Tran
(74) Attorney, Agent, or Firm—Townsend and Townsend and Crew LLP; Steven J. Cahill

(57) ABSTRACT

Non-volatile memory transistors are provided that include a floating gate formed from first and second layers of material such as polysilicon. The second floating gate layer is selectively grown or deposited on top of the first gate layer, eliminating the need to mask for positioning of the second floating gate layer. The memory transistors are separated by isolation regions. The second floating gate layer overlaps portions of the isolation regions to provide a high control gate-to-floating gate coupling ratio. The process enables smaller memory transistors. Floating gate to isolation overlap, and therefore floating gate to floating gate spacing, is controlled by selective deposition or selective epitaxial growth of the second polysilicon layer.

24 Claims, 7 Drawing Sheets

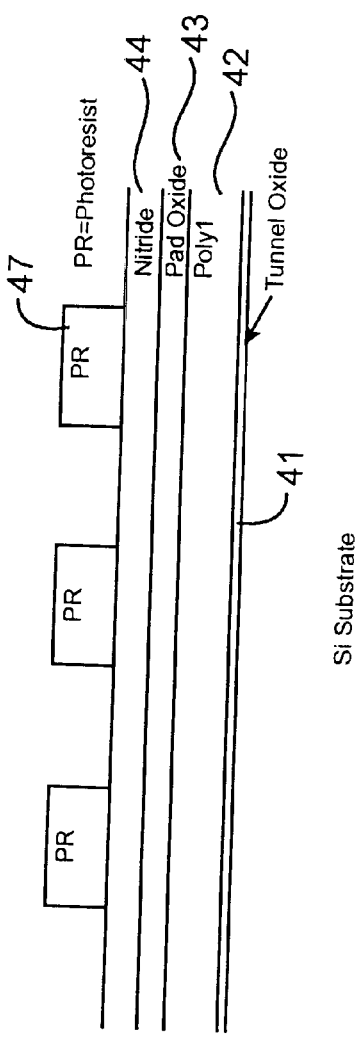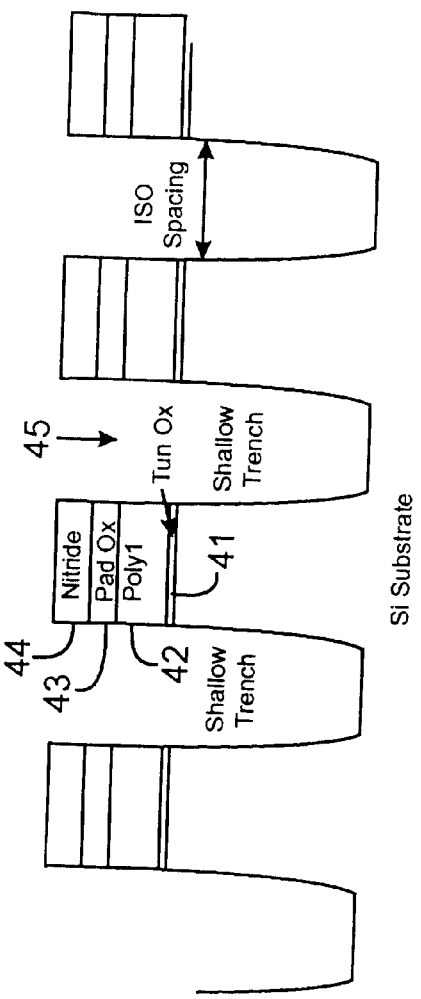

NON-VOLATILE MEMORY CELLS WITH SELECTIVELY FORMED FLOATING GATE

BACKGROUND OF THE INVENTION

This invention relates to semiconductor memories, and is particular to a non-volatile memory and an improved process for manufacturing it.

FIGS. 1A–1B illustrate a prior art process for forming non-volatile memory cells, such as flash cells, with shallow trench isolation regions separating adjacent cell structures. After depositing an optional pad oxide layer and a nitride layer, an isolation mask 11 is used to define shallow trench isolation regions 12, which after etching, are filled with material, such as high density plasma (HDP) oxide as shown in FIGS. 1A–1B. Subsequently, chemical-mechanical polishing (CMP) is performed followed by removal of the nitride layer.

Well and channel masking, and respective implants are then performed (not shown). Subsequently, tunnel oxide layer 13 is formed in the memory array area, followed by the deposition of a first polysilicon layer (Poly 1). A separate mask and etch are applied to the device to pattern the polysilicon layer in the memory array to form floating gates 14. Thus, the formation of shallow trench isolation regions 12 and floating gates 14 are separated in this process.

The formation of floating gates 14 is followed by conventional processing steps, such as the deposition of an insulating dielectric layer of oxide-nitride-oxide (ONO), ONO removal from the peripheral circuit regions, formation of high voltage (HV) and (if separate from the tunnel oxide) low voltage (LV) gate oxide layers for peripheral transistors, the deposition of a second polysilicon layer (Poly 2), and the patterning the second polysilicon layer to form control gates of the memory cells and gates of transistors in the peripheral regions. Typically this is formed by a self-aligned etch. Subsequently, source/drain junctions of memory cells and periphery transistors are formed, and polysilicon-to-metal dielectric layers are formed (e.g. IPO, PSG, BPSG). The process is completed by back end steps such as forming contacts, metallization, interconnections, and passivation.

The disadvantages of the process of FIGS. 1A–1B include the fact that separate masks are required to form shallow trench isolation regions 12 and floating gates 14, which increases the total number of masking steps. In addition, the spacing between floating gates 14 is determined by limitations of the photolithography process used. Floating gates 14 must be maintained at least a specified minimum distance apart from each other to maintain isolation between the floating gates of adjacent memory cells. Photolithography processes typically cannot resolve features of the transistors below a certain minimum width determined by characteristics of the photolithography equipment and process technology employed.

In memory arrays, cell transistors are separated by isolation regions. The width of isolation regions (ISO space in FIG. 1B) is limited by photolithographic resolution of floating gate to floating gate spacing between cells, and the requirements of floating gate to isolation overlap to maintain a desired control-to-floating gate coupling ratio. Depending on the process technology employed, Poly 1 to Poly 1 spacing cannot be typically reduced below the minimum feature size resolution.

For instance, in 0.18 µm process technology, the minimum spacing between floating gates 14 will be defined at about 0.18 µm to maintain isolation, which limits memory cell size scaling. Further, although the mask for floating gates 14 is designated as a critical mask with more stringent requirements on misalignment tolerance, Poly 1 mask misalignment may significantly impact memory cell characteristics and prevent the size of the memory cells from being reduced. FIG. 1B shows an example of Poly 1 misalignment.

For instance, if the Poly 1 mask is misaligned in such a way that, after patterning, a Poly 1 edge is on the active area instead of the isolation region, or even at the border of the isolation and active regions, the cell transistor and the whole memory array will not function properly. To prevent this, the Poly 1 to ISO (isolation) overlap should be large enough to allow for worst case misalignment. Thus, the Poly 1 to Poly 1 spacing requirements and misalignment considerations limit memory cell, and overall flash chip size.

FIGS. 2A–2D illustrate another conventional non-volatile memory process. After proper processing and cleaning the silicon substrate (e.g. using sacrificial oxide growth and etch), tunnel oxide layer 20 is formed, followed by deposition of first polysilicon layer 21 (Poly 1), followed by the formation of an optional pad oxide layer and a nitride layer, as shown in FIG. 2A. Then, photoresist is deposited and used to pattern for the formation of shallow trench isolation (STI) regions 25 and polysilicon layer 21 as shown in FIG. 2B. Thus, the Poly 1 patterning in this process is self-aligned to forming isolation regions (i.e., shallow trench isolation regions). Subsequently, trench isolation regions 25 are filled with HDP gap filling material 26 as shown in FIG. 2C.

Next, the well and channel implantation stepw are performed. After that, a second polysilicon layer 27 is deposited and patterned such that the patterned second polysilicon layer 27 together with the previously patterned first Poly 1 layer 21 form the floating gates for the cells, as shown in FIG. 2D. Polysilicon layer 27 is also referred to as Poly 1, because it is in ohmic contact with polysilicon layer 21. Accordingly, a separate mask is needed for defining the location of second polysilicon layer 27. The second polysilicon layer 27 serves to provide the floating gate overlap of isolation regions 26 to increase the floating gate-to-control gate coupling ratio. Then, inter-poly dielectric layer 28 (e.g., an ONO composite layer) is deposited. After ONO is removed from the peripheral circuit area of the device and the peripheral transistors' gate oxide has been formed, polysilicon layer 29 (Poly 2) is deposited and patterned to form the lower layer of the control gate in the memory array, as well as the gates of the peripheral transistors. The memory cell gate stack is then formed by a self-aligned etch. Other conventional steps may follow.

Although the process of FIGS. 2A–2D involves forming shallow trench regions 25 to be self-aligned with the first Poly 1 layer 21, an additional mask is still necessary to pattern the second Poly 1 layer 27 so that the floating gate regions overlap isolation regions 26, increasing the total masking steps. A further disadvantage is the fact that the spacing between the floating gates in the memory array is determined by limitations of the photolithographic process used for forming the second Poly 1 layer 27. Furthermore, the mask used to form second Poly 1 layer 27 may be misaligned causing limitations on reducing the memory transistor size, as discussed above.

It would therefore be desirable to provide a process for forming non-volatile memory cells wherein the spacing between floating gates of the cells can be reduced without being limited by a photolithography process. It would be further desirable to minimize or eliminate the problem of floating gate misalignment that also limits cell size reduction.

BRIEF SUMMARY OF THE INVENTION

The present invention provides methods and structures for arrays of non-volatile memory transistors (e.g., flash memory cells) which include floating gates formed from two layers of material such as polysilicon. The second (upper) floating gate layer is selectively grown or deposited on top of the first floating gate layer, eliminating the need to mask the deposition of the second floating gate layer. This allows the memory transistors to be separated by isolation regions which can be more aggressively scaled to smaller dimensions.

In a preferred embodiment, the second floating gate layer overlaps portions of the isolation regions to provide a high control gate-to-floating gate coupling ratio. Because of this overlap, non-volatile memory transistors of the present invention can be reduced in size to increase the density of the memory array. The floating gate to isolation overlap, and therefore floating gate to floating gate spacing, is controlled by precise selective deposition or selective epitaxial growth of the second polysilicon layer and not photolithography. Therefore, the floating gate to floating gate spacing can be reduced below photolithography resolution. No masking step is needed to form the second floating gate layer, eliminating floating gate misalignment problems. Floating gate to isolation overlap can be further reduced by forming a non-uniform floating gate surface that significantly increases the control gate to floating gate coupling ratio by increasing surface area and capacitance of the inter-gate dielectric capacitor.

BRIEF DESCRIPTION OF THE DRAWINGS

FIGS. 3A–3D are cross sectional views along a word line illustrating process steps used to form non-volatile memory cells in accordance with an embodiment of the present invention;

DETAILED DESCRIPTION OF THE INVENTION

Figure 1A:
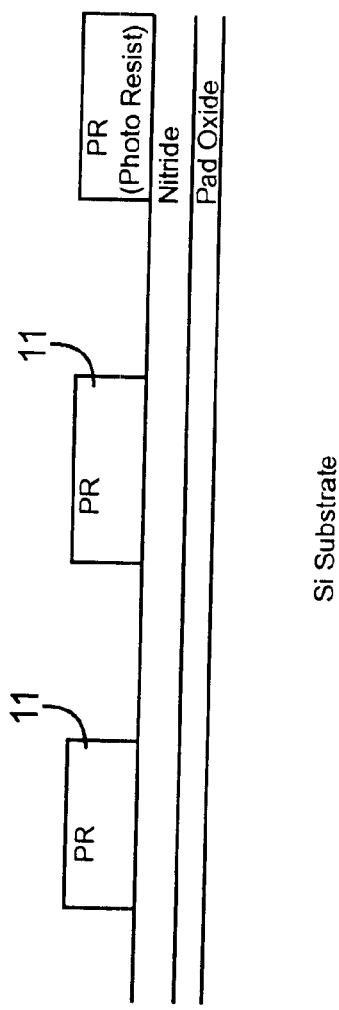
FIGS. 1A–1B are cross sectional views along a word line illustrating process steps used to form prior art non-volatile memory cells.
Figure 1B:
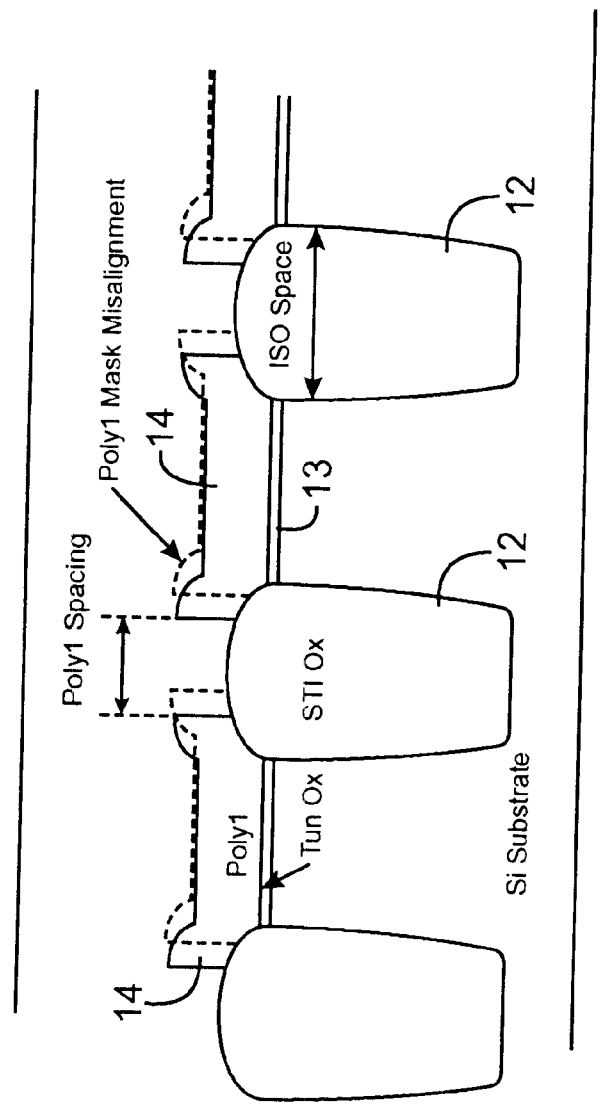
Figure 2A:
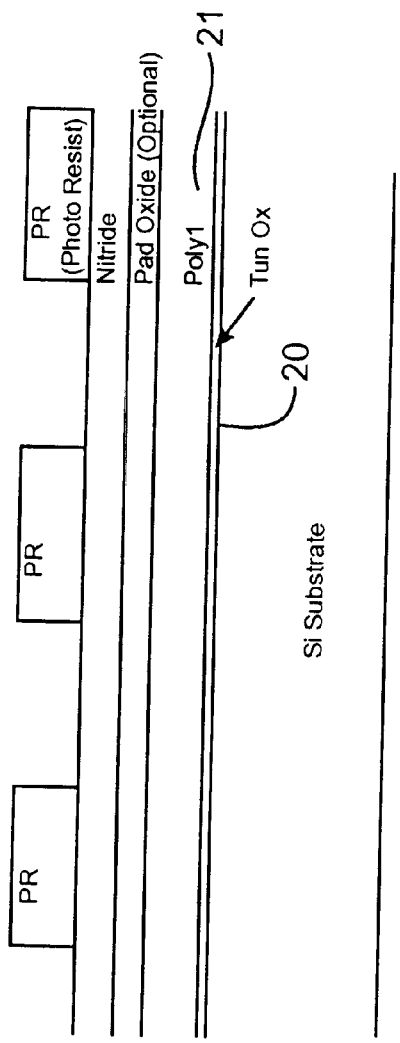
FIGS. 2A–2D are cross sectional views along a word line illustrating process steps used to form other prior art non-volatile memory cells.
Figure 2B:
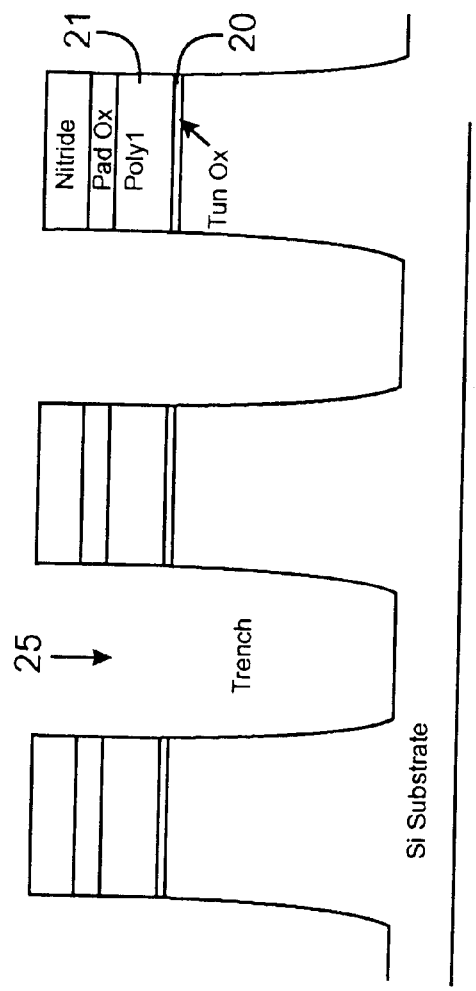
Figure 2C:
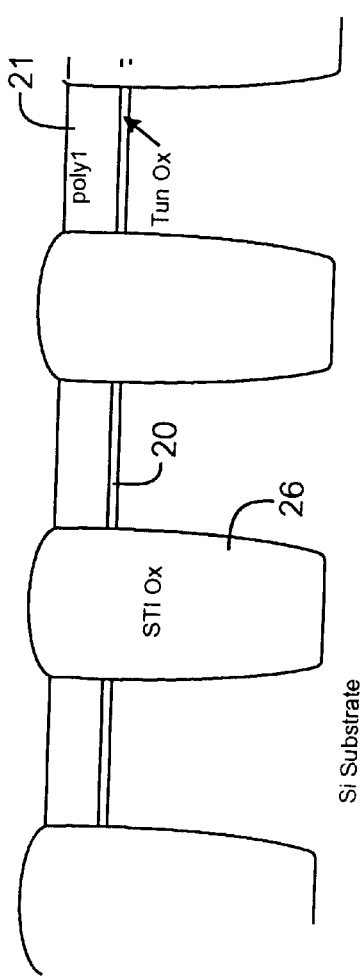
Figure 2D:
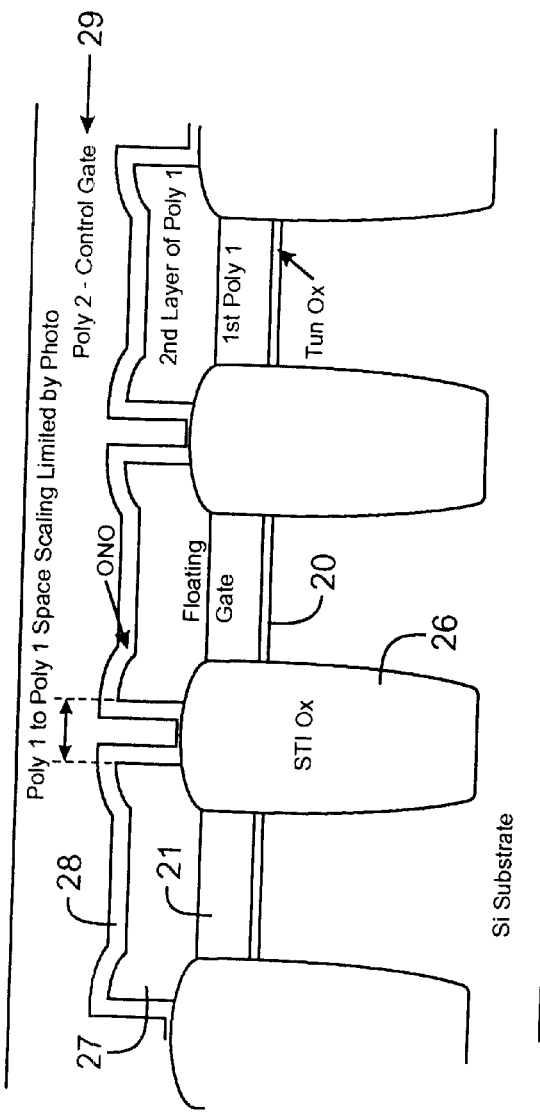
Figure 3C:
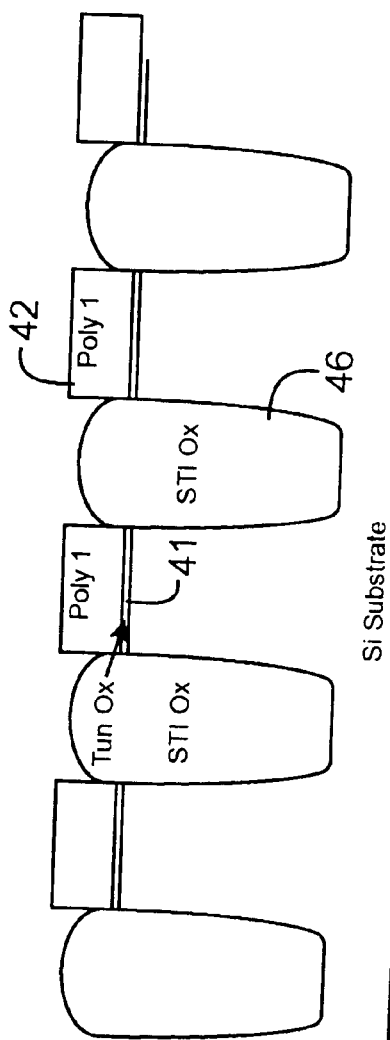

FIGS. 3A–3D are cross sectional views along a word line illustrating process steps used to form non-volatile memory cells (e.g., flash memory cells) in accordance with an embodiment of the present invention. After performing conventional processing steps such as wafer cleaning, sacrificial oxide is grown and removed. Then, tunnel oxide layer 41 is grown on the surface of a silicon substrate as shown in FIG. 3A. Subsequently, a first polysilicon layer 42 (first poly 1 layer) is deposited on top of tunnel oxide layer 41, and then an optional pad oxide layer 43 is formed on layer 42. Next, a silicon nitride layer 44 is deposited on layer 43. A photoresist layer 47 is formed on nitride layer 44 and the photoresist is patterned to define the shallow trench isolation regions. A conventional silicon etch is then used to form shallow trench isolation (STI) regions 45 as shown in FIG. 3B. The resulting regions of polysilicon layer 42 form first portions of the floating gate of each memory cell in the memory array. Thus, by the described process, the first portion of the floating gate is self-aligned with STI regions 45.

STI regions 45 are then filled with an insulating filling material 46 such as high density plasma (HDP) oxide. To flatten the surface after filling, a CMP process is preferably employed. A nitride striping step then removes the remainder of nitride layer 44. STI regions 45 and insulating material 46 insulates memory cells in the array from each other. Because first polysilicon layer 42 is formed before STI regions 45 are etched, the polysilicon regions 42 are self-aligned with STI regions 45. Therefore there is no overlap of polysilicon regions 42 over insulating material 46, as shown in FIG. 3C. Polysilicon regions 42 form a plurality of stripes that are perpendicular to the cross section shown in FIG. 3B (i.e., the stripes come out of the page).

Figure 3D:
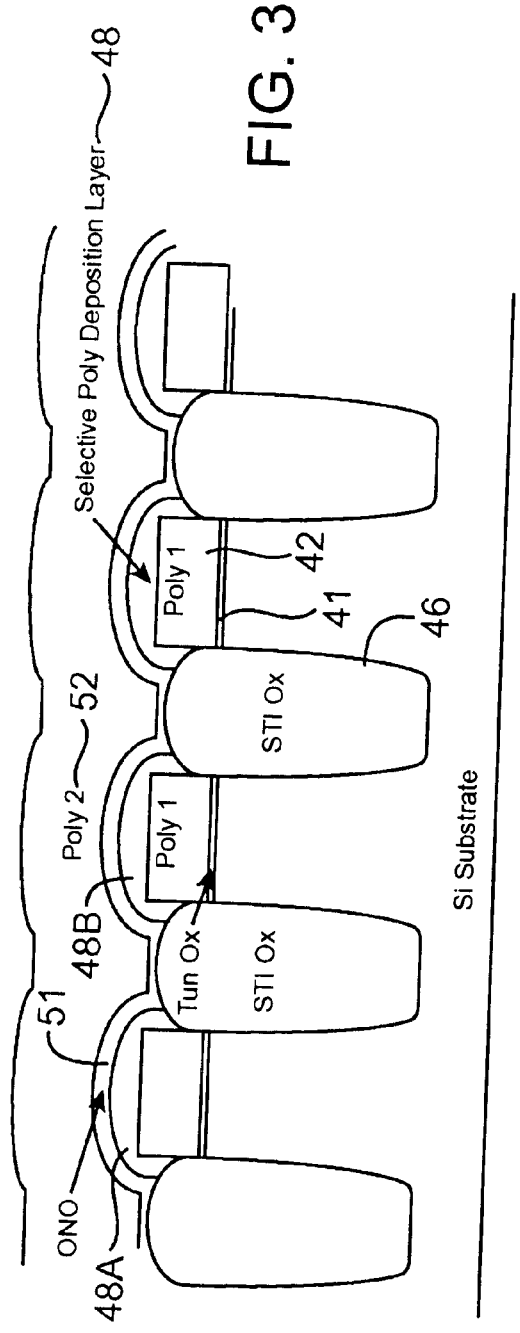

Subsequently, a second layer of polysilicon 48 is selectively formed on top of first poly 1 regions 42. Although this step is a second deposition of polysilicon, it is referred to herein as a second layer of poly 1 because it is in ohmic contact with poly 1 layer 42. Second poly 1 regions 48 can be formed using well known selective deposition or selective epitaxial growth of polysilicon. During selective deposition or selective growth of second poly 1 regions 48, polysilicon atoms align and bond only with pre-existing polysilicon in poly 1 regions 42, and not with the silicon dioxide insulating material in regions 46. As polysilicon atoms are deposited, polysilicon regions (such as 48A and 48B) form around pre-existing poly 1 regions 42. Regions 48A and 48B extend vertically and laterally so that they overlap portions of shallow trench isolation regions 46, as shown in FIG. 3D. In particular, second poly 1 regions 48 are wider than first poly 1 regions 42 and overlap portions of isolation regions 46.

As discussed, second poly 1 regions (such as regions 48A–48B) form only on first poly 1 regions 42 and not on isolation material 46. By using selective deposition or growth to form second poly 2 regions 48, the spacing between second poly 2 regions (e.g., regions 48A and 48B) can be reduced below minimum width limitations imposed by the photolithographic process. This allows the spacing between, second poly 1 regions 48A–48B to be reduced to the minimum distance required to maintain electrical isolation between adjacent floating gates, a smaller dimension than the minimum width limitation of the photolithographic process. Therefore, the isolation spacing between memory cells can be reduced and the density of cells in a memory array of a given size can be increased. Because a mask step is not needed to selectively form second poly 1 regions 48, the number of process steps needed to form the memory array is reduced.

After formation of layer 48, an insulating inter-polysilicon dielectric layer 51 (such as ONO) is formed on top of second poly 1 regions 48 and the exposed STI regions. Then, a polysilicon layer 52 (poly 2) is deposited on top of dielectric layer 51 and patterned. Polysilicon layer 52 forms the control gates of the memory cells in the array. Polysilicon layer 52 may also be used to form the gates of transistors peripheral to the memory array. Polysilicon layer 52 is patterned to form a plurality of control gate (word line) stripes in the memory array and the gates of the peripheral transistors using masking and etching steps. The word line stripes of layer 52 (poly 2) are parallel to the cross section shown in FIG. 3D and are perpendicular to the poly 1 stripes.

The gates of the memory cells are then patterned using an etch process that is self-aligned to the control gate layer 52 stripes that form the word lines. The self-aligned etch penetrates down to tunnel oxide layer 41 in between the word line stripes of layer 52 to form stacked gates. FIG. 3D illustrates a cross section of the memory array along a word line stripe of polysilicon layer 52. The self-aligned etch does not effect the shape of the polysilicon or ONO regions shown in FIG. 3D along each word line cross section.

One of the most important parameters that determines the performance of the memory cells is the control-to-floating gate coupling coefficient. The gate coupling coefficient has a primary effect on the potential of the floating gate. A higher gate coupling coefficient brings the potential of the floating gate closer to that of the control gate for any given potential on the control gate of the memory cell. The closer the potential on the floating gate to that of the control gate for a given control gate bias, the better the performance of the memory cell, including higher program and erase efficiency and read current. A higher gate coupling coefficient allows also lowering operating voltages of memory cells, simplifying flash chip design, especially for lower power supply voltages.

Each of polysilicon regions 42, tunnel oxide 41, and the channel regions of the silicon substrate form a capacitor referred to as the tunnel oxide capacitor. The primary factors that determine the control-to-floating gate coupling coefficient are the inter-polysilicon capacitance (i.e., the floating gate to control gate capacitance) and the tunnel oxide capacitance. The gate coupling coefficient increases as the inter-polysilicon capacitance increases. The gate coupling coefficient also increases as tunnel oxide capacitance decreases.

Tunnel oxide capacitance is determined by tunnel oxide thickness, and cell active width. In a preferred embodiment, the tunnel oxide thickness is selected to be a minimum thickness providing maximum read current and program and erase efficiency, while assuring charge retention characteristics. Tunnel oxide thickness cannot be independently reduced. Tunnel oxide capacitance is also proportional to the cell active width, which cannot be reduced below minimum feature size of the photolithography process employed. The tunnel oxide thickness in a flash cell of our preferred embodiment is about 90–100 angstroms.

The inter-polysilicon capacitance can be increased by increasing the inter-polysilicon capacitor surface area or by reducing the thickness of ONO layer 51. The thickness of ONO layer 51, however, cannot be reduced much, because the ability of the floating gate to retain trapped charge carriers is reduced as the ONO layer thickness is reduced. Typically, in non-volatile memory technologies, such as flash technology, the thickness of ONO layer 51 is now at or near its minimum value, beyond which charge retention in the floating gate will be compromised, which is highly undesirable. An example of ONO layers thickness is 40/60/45 angstroms.

Poly 1 regions 48 have a larger surface area beneath polysilicon layer 52, than poly 1 regions 42. Poly 1 regions 48 are part of the floating gates of the memory cells. Regions 48 increase the area of overlap between the control gate 52 and the floating gate regions. Therefore, forming second poly 1 regions 48 so that they overlap isolation regions 46 increases the inter-polysilicon capacitance. Second poly 1 regions 48 significantly improve the gate coupling coefficient and the performance of the memory cell, allowing faster access time, and enhanced program and erase efficiency. In addition, the supply voltage and power consumption are reduced because of the increased coupling coefficient.

Second poly 1 regions 48 are self-aligned with first poly 1 regions 42, because regions 48 are selectively deposited or grown on the surface of the device according to the location of polysilicon regions 42. No mask layer is needed to form polysilicon regions 48, therefore there is no misalignment to first layer poly 1 of second poly 1 regions.

The selective deposition and epitaxial growth processes allow regions 48 to be precisely placed on regions 42 regardless of the precision of the photolithography process used. The process for formation of polysilicon regions 48 allows tight control so the thickness of polysilicon regions 48 can be carefully chosen. The spacing of polysilicon regions 48 is also tightly controllable by the selective deposition and/or epitaxial growth processes. As a result, the lateral spacing of polysilicon regions 48 (and the width of the STI regions) can be reduced significantly compared to the prior art, for example, to as small as 0.05–0.07 $\mu$m in a 0.18 $\mu$m process. These reduced dimensions allow the size of memory cells to be significantly reduced.

In prior art processes, memory cell isolation spacing had to be large enough to accommodate a sufficient poly 1 to isolation overlap and to resolve poly 1 to poly 1 spacing, which depended on photolithography capabilities. Large enough poly 1 to isolation overlap is needed to preserve functionality of the cell and the memory array in the case of poly 1 mask misalignment. In a case of a small poly 1 to isolation overlap, misalignment may result in the poly 1 edge landing on the active area of the cell instead of isolation, so that the cell would cease normal functioning.

Figure 4:
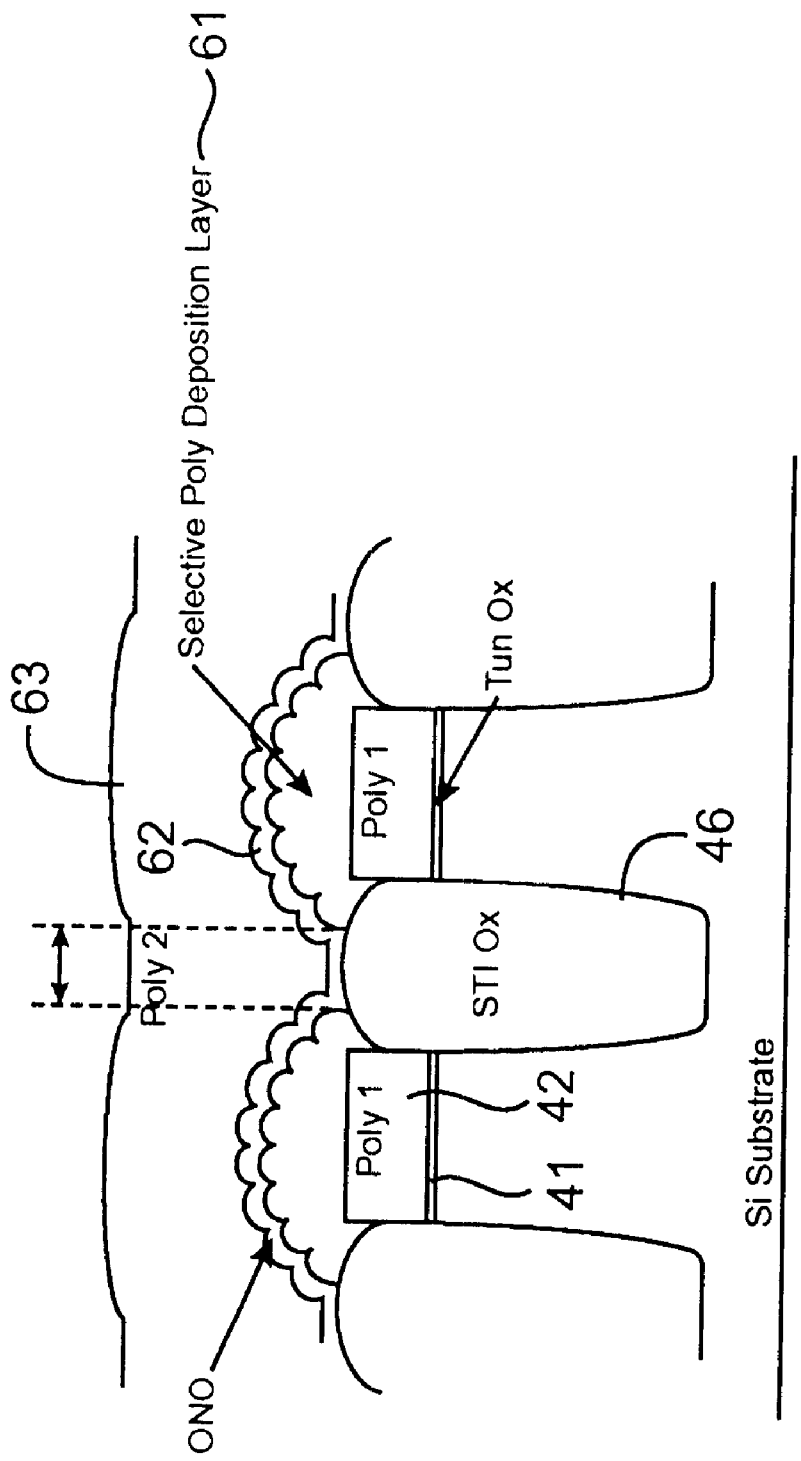
FIG. 4 is a cross sectional view along a word line illustrating a second embodiment of non-volatile memory cells in accordance with the present invention.

A second embodiment of the present invention is shown in FIG. 4, which illustrates a technique that increases the control gate-to-floating gate coupling ratio. FIG. 4 illustrates a cross section (along a word line) of memory cells formed with polysilicon layers 42, 61, and 63 in accordance with the principles of the present invention. Shallow trench isolation regions 46, tunnel oxide layer 41, and first poly 1 regions 42 are formed as discussed above with respect to the previous embodiment.

In a first embodiment of FIG. 4, polysilicon is selectively deposited to form a non-uniform, non-flat polysilicon layer 61 on top of layer 42. Layer 61 may, for example, comprise a hemispherical grained polysilicon layer, as shown in FIG. 4. The additional non-uniform polysilicon layer 61 can be deposited using LPCVD under the conditions for conventional deposition of polysilicon, except for deposition temperature and pressure, as discussed next.

The deposition of a hemispherical grained polysilicon layer may be carried out, for example, with He-diluted $SiH_4$ (20%) gas at 1.0 torr pressure and at 550° C. The effective surface area of hemispherical grained polysilicon is at least twice as large as that of conventional polysilicon, because of its small hemispherical grained surface. The grains may be, for example, about 80 nm in diameter. Further details of hemispherical grained deposition are discussed in M. Sakao, et al., "A Capacitor-Over-Bit-Line (COB) Cell With a Hemispherical-Grain Storage Node for 64 Mb DRAMs," International Electron Device Meeting, p. 655–658, 1990, which is incorporated by reference herein.

In a second embodiment of FIG. 4, a hemispherical grained polysilicon layer 61 is formed on polysilicon 42 by using processing steps called the seeding method designed to modify the morphology and topography of polysilicon layer 42. An example of the seeding method involves irradiating the surface of polysilicon layer 42 with $Si_2H_6$ molecules at a high temperature (e.g., 580° C.) to create amorphous silicon seeds over the surface of polysilicon regions 42, and then annealing the wafer in a high vacuum at the same temperature. CVD is then used to form hemispherical grains of polysilicon on the surface of regions 42. Further details of the seed method are discussed in H. Watanabe, et al., "Hemispherical Grained Silicon (HSG-Si) Formation on In-Situ Phosphorous Doped Amorphous-Si Using the Seeding Method," International Conference on Solid State Devices and Materials, p. 422–424, 1992, which is incorporated herein by reference. Other methods of forming a non-flat or a non-uniform gate layer over layer 42 can be used to achieve the advantages of the present invention.

In still another embodiment of the techniques discussed with respect to FIG. 4, selective deposition or epitaxial growth of polysilicon may be used to form a second floating gate layer 48 over first floating gate layer 42 as discussed with respect to FIG. 3D. Subsequently, polysilicon is selectively deposited on top of floating gate layer 48 to form a third polysilicon layer that has a non-flat, non-uniform surface. The third polysilicon layer may comprise, for example, hemispherical grains of polysilicon that are formed using the seeding method or He-diluted SiH$_4$ as discussed in Sakao et al. In another embodiment, selective deposition can be used to form a grainy floating gate surface by using larger size polysilicon grains during the selective deposition process.

An inter-polysilicon dielectric layer 62 (such as ONO) is formed on the grained surface of regions 61, followed by the deposition of second polysilicon Poly 2 layer 63, which forms the control gates of the memory cells in the array and may form the gates of transistors in the peripheral region of the device. As dielectric layer 62 is deposited, it forms a hemispherical grained pattern contoured to the hemispherical grained upper surface of regions 61 as shown in FIG. 4. The surface area of the interface between regions 61 and 62 is greatly increased, because of the non-uniform hemispherical pattern of the interface.

When it is deposited, the polysilicon layer 63 will conform to the hemispherical grained surface of dielectric layer 62. Therefore, because of the non-uniform hemispherical pattern of the interface, the surface area of the interface between polysilicon layer 63 and dielectric layer 62 is greatly increased. The increased surface area in the two polysilicon to dielectric interfaces provides an increased control-gate-to-floating gate capacitance and coupling ratio which improves the performance of the device, as described above. The non-uniform surface floating gate shown in FIG. 4 allows the floating gate-to-isolation overlap and the memory cell size to be reduced, while maintaining an adequate coupling ratio. A more detailed description of the processes for forming the hemispherical grained surfaces in non-volatile memories is provided in "Non-Volatile Memory Cell with Non-Uniform Surface Floating Gate and Control Gate," commonly assigned U.S. patent application Ser. No. 09/948,612 to Rabkin et al., filed Sep. 7, 2001, which is incorporated by reference herein.

Figure 5A:
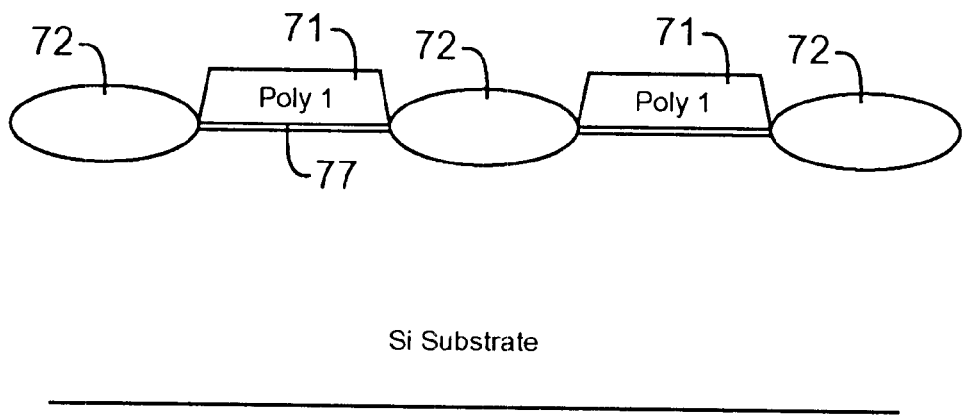
FIGS. 5A–5B are cross sectional along a word line views illustrating a third embodiment of non-volatile memory cells in accordance with the present invention.
Figure 5B:
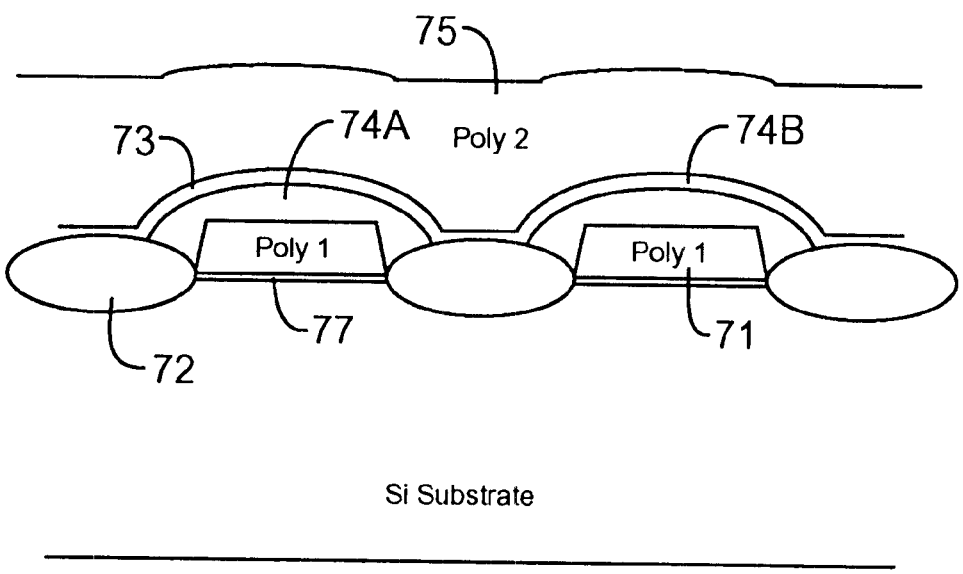

FIGS. 5A–5B are cross sectional views along a word line illustrating a third embodiment of non-volatile memory cells in accordance with the present invention. Memory cells formed in the embodiment of FIGS. 5A–5B are isolated by oxide regions 72 formed in a silicon substrate by local oxidation of silicon (LOCOS). Tunnel oxide layer 77 is formed on the silicon substrate. A first poly 1 layer is then deposited and patterned using photolithography to form polysilicon regions 71.

Subsequently, polysilicon is selectively deposited or selectively grown, in the manner described above, on polysilicon regions 71 to form polysilicon regions such as 74A and 74B. Polysilicon regions 74A–74B overlap oxide regions 72 as shown in FIG. 5B. Regions 74A–74B provide the advantages discussed above with respect to the previous embodiments. Polysilicon regions 71 together with regions 74A–74B form the floating gates for the memory cells. Dielectric layer 73 (such as ONO) is formed on regions 74A–74B and oxide regions 72, and then polysilicon layer 75 is deposited on dielectric layer 73 as shown in FIG. 5B. Polysilicon layer 75 is used to form the control gates for the memory transistors. In further embodiments of the present invention, other techniques may be employed to isolate the memory cells, while realizing the advantages of selective formation of a second floating gate layer to allow reduction of the spacing between the floating gates.

Trench isolation can be shallow (STI) or deep (DTI). An example of shallow trench isolation (STI) depth is 0.22–0.30 μm. In some flash technologies, such as isolated substrate (IS) NAND, deeper trench isolation is used in the memory array. An example of deep trench isolation (DTI) depth is 0.6–1.0 μm.

The present invention has broad applicability in the non-volatile memory technology area, and may be applied to any cell technology which includes floating gates such as, for example, flash memory cells or EEPROM. Accordingly, although FIGS. 3A–3D, 4, and 5A–5B show stacked-gate cells, the invention is not limited as such. Other floating-gate cell structures, such as double-poly or triple-poly split gate flash cells and EEPROM cell structures can be modified by one skilled in the art to realize the features and advantages of the present invention.

While the present invention has been described with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth. Therefore, modifications may be made to adapt a particular situation or material to the teachings of the invention without departing from the essential scope and spirit of the present invention. It is intended that the invention not be limited to the particular embodiments disclosed, but that the invention will include all embodiments and equivalents falling within the scope of the claims.

What is claimed is:

1. A method for forming an array of memory cells, the method comprising:
   forming first floating gate regions between isolation regions in semiconductor material;
   selectively forming second floating gate regions only on the first floating gate regions by applying a material that bonds to the first floating gate regions but not to the isolation regions;
   forming a dielectric layer on at least the second floating gate regions; and
   forming a control gate layer over the dielectric layer.

2. The method of claim 1 wherein the first floating gate regions, the second floating gate regions, and the control gate layer comprise polysilicon.

3. The method of claim 1 wherein the isolation regions comprise trench isolation regions.

4. The method of claim 1 wherein forming second floating gate regions comprises selective deposition of a material on the first floating gate regions that bonds to the first floating gate regions and not to the isolation regions.

5. The method of claim 1 wherein the isolation regions comprise oxide regions formed from local oxidation of silicon.

6. The method of claim 1 wherein forming first floating gate regions between the isolation regions comprises:
   depositing a layer of polysilicon;
   forming trench isolation regions in the semiconductor device; and
   filling the trench isolation regions with an insulating material, wherein the trench isolation regions separate the first floating gate regions from each other.

7. The method of claim 6 wherein forming trench isolation regions comprises etching the semiconductor to a depth between 0.22 and 1.0 μm.

8. The method of claim 1 wherein forming the first floating gate regions between the isolation regions comprises:
   forming oxide isolation regions in the semiconductor device using local oxidation of silicon; and
   depositing and patterning a layer of polysilicon to form the first floating gate regions between the oxide isolation regions.

9. The method of claim 1 wherein the dielectric layer comprises a multilayer structure of oxide-nitride-oxide.

10. The method of claim 9 wherein the dielectric layer comprises oxide-nitride-oxide-nitride.

11. The method of claim 1 wherein the first floating gate regions are formed from a first polysilicon layer; and selectively forming the second floating gate regions that bond only to the first floating gate regions further comprises selectively depositing a second polysilicon layer that bonds only to the first floating gate regions to form the second floating gate regions.

12. The method of claim 1 wherein no masking layer is used in forming the second floating gate regions.

13. The method of claim 1 wherein the first floating gate regions comprise polysilicon; and selectively forming the second floating gate regions that bond only to the first floating gate regions further comprises selectively growing a polysilicon epitaxial layer that bonds only to the first floating gate regions to form the second floating gate regions.

14. The method of claim 1 wherein the second floating gate regions have a non-flat, non-uniform surface.

15. The method of claim 14 wherein the second floating gate regions comprise hemispherical grained polysilicon.

16. A method for forming floating gates in an array of non-volatile memory cells, the method comprising:
   forming a first portion of each floating gate adjacent to isolation regions in a semiconductor substrate; and
   forming a second portion of each floating gate over each first portion by introducing a material over the array that bonds with the first portion of each floating gate to form the second portion of each floating gate,
   wherein the material does not bond with the isolation regions, and the second portion of each floating gate overlaps adjacent isolation regions.

17. The method of claim 16 wherein forming the first portion of each floating gate further comprises:
   simultaneously removing predefined portions of a first layer of polysilicon and portions of the semiconductor substrate, remaining portions of the first layer of polysilicon forming the first portion of each floating gate, and the portions of the substrate region removed forming isolation regions that isolate the first portions of the floating gates.

18. The method of claim 17 wherein forming the second portion of each floating gate further comprises:
   forming the second portion of each floating gate without using a masking layer.

19. The method of claim 16 wherein the isolation regions are one of trench isolation and local oxidation of silicon.

20. The method of claim 16 wherein forming the second portion of each floating gate further comprises:
   selectively depositing in the array region a polysilicon layer that interacts only with the first portion of each floating gate to form the second portion of each floating gate.

21. The method of claim 16 wherein the act of forming the second portion of each floating gate further comprises:
   selectively growing in the array region a polysilicon epitaxial layer that interacts only with the first portion of each floating gate to form the second portion of each floating gate.

22. The method of claim 16 wherein the second portion of the floating gates has at least one non-uniform surface.

23. The method of claim 22 wherein the non-uniform surface of the second portion of each floating gate comprises a hemispherical grained surface.

24. The method of claim 16 wherein the first and the second portions of each of the floating gates comprise polysilicon.

* * * * *